US009490221B2

United States Patent
Arai et al.

(10) Patent No.: US 9,490,221 B2
(45) Date of Patent: Nov. 8, 2016

(54) SEMICONDUCTOR DEVICE HAVING MULTIPLE MAGNETIC SHIELD MEMBERS

(71) Applicant: SHINKO ELECTRIC INDUSTRIES CO., LTD., Nagano-shi, Nagano (JP)

(72) Inventors: Tadashi Arai, Nagano (JP); Yukiharu Takeuchi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/870,078

(22) Filed: Sep. 30, 2015

(65) Prior Publication Data
US 2016/0093795 A1     Mar. 31, 2016

(30) Foreign Application Priority Data

Sep. 30, 2014    (JP) ................................. 2014-201765

(51) Int. Cl.
     *H01L 43/02*      (2006.01)
     *H01L 23/552*      (2006.01)

(52) U.S. Cl.
CPC ............. *H01L 23/552* (2013.01); *H01L 43/02* (2013.01)

(58) Field of Classification Search
CPC ...................................................... H01L 43/02
See application file for complete search history.

(56) References Cited

U.S. PATENT DOCUMENTS

| | | | | |
|---|---|---|---|---|
| 7,592,639 | B2* | 9/2009 | Maeda ................. | C09K 11/025 257/100 |
| 7,642,633 | B2* | 1/2010 | Hirose .................... | H01L 24/49 257/685 |
| 8,466,539 | B2* | 6/2013 | Li ......................... | H01L 23/552 257/422 |
| 8,652,880 | B2* | 2/2014 | Bando ............... | H01L 23/49503 257/659 |
| 9,324,663 | B2* | 4/2016 | Watanabe ............... | H01L 23/13 |
| 2003/0062420 | A1* | 4/2003 | Ohta ................ | G06K 19/07728 235/492 |
| 2004/0232536 | A1* | 11/2004 | Fukuzumi ............. | H01L 23/057 257/684 |
| 2005/0233178 | A1* | 10/2005 | Sugimoto ............. | G11B 5/667 428/839 |
| 2006/0180880 | A1* | 8/2006 | Wang .................... | H01L 23/552 257/414 |

(Continued)

FOREIGN PATENT DOCUMENTS

JP      2013-207059      10/2013

OTHER PUBLICATIONS

This application is co-pending with U.S. Appl. No. 14/870,084, filed Sep. 30, 2015.

*Primary Examiner* — Ida M Soward
(74) *Attorney, Agent, or Firm* — Rankin, Hill & Clark LLP

(57) ABSTRACT

A semiconductor device includes a wiring substrate, a lower magnetic shield member, a semiconductor chip, and an upper magnetic shield member. The lower magnetic shield member is provided on the wiring substrate. The semiconductor chip is provided on the lower magnetic shield member. The semiconductor chip includes a magnetic memory element. The upper magnetic shield member is provided on the semiconductor chip. The semiconductor chip is disposed between the upper magnetic shield member and the lower magnetic shield member. The lower magnetic shield member and the upper magnetic shield member include a soft magnetic resin. The lower magnetic shield member and the upper magnetic shield member are in direct contact with each other.

20 Claims, 10 Drawing Sheets

(56) References Cited

U.S. PATENT DOCUMENTS

| | | | |
|---|---|---|---|
| 2011/0298111 A1* | 12/2011 | Kim | H01L 21/561 |
| | | | 438/113 |
| 2011/0312108 A1* | 12/2011 | Onodera | H01L 21/568 |
| | | | 438/15 |
| 2012/0018858 A1* | 1/2012 | Chen | H01L 21/565 |
| | | | 257/659 |
| 2012/0119338 A1* | 5/2012 | Watanabe | H01L 23/552 |
| | | | 257/659 |
| 2013/0002042 A1* | 1/2013 | Hatase | H01F 27/327 |
| | | | 307/104 |
| 2013/0256819 A1* | 10/2013 | Watanabe | H01L 43/02 |
| | | | 257/422 |
| 2015/0243607 A1* | 8/2015 | Jang | H01L 23/564 |
| | | | 438/113 |

* cited by examiner

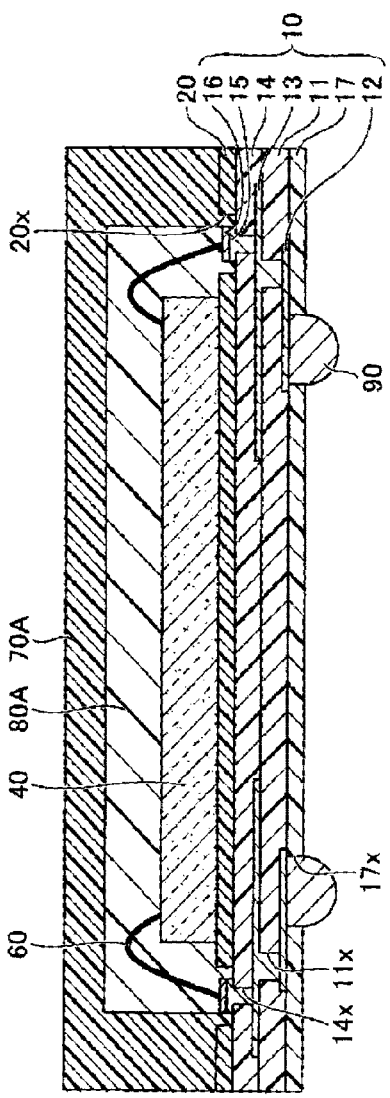
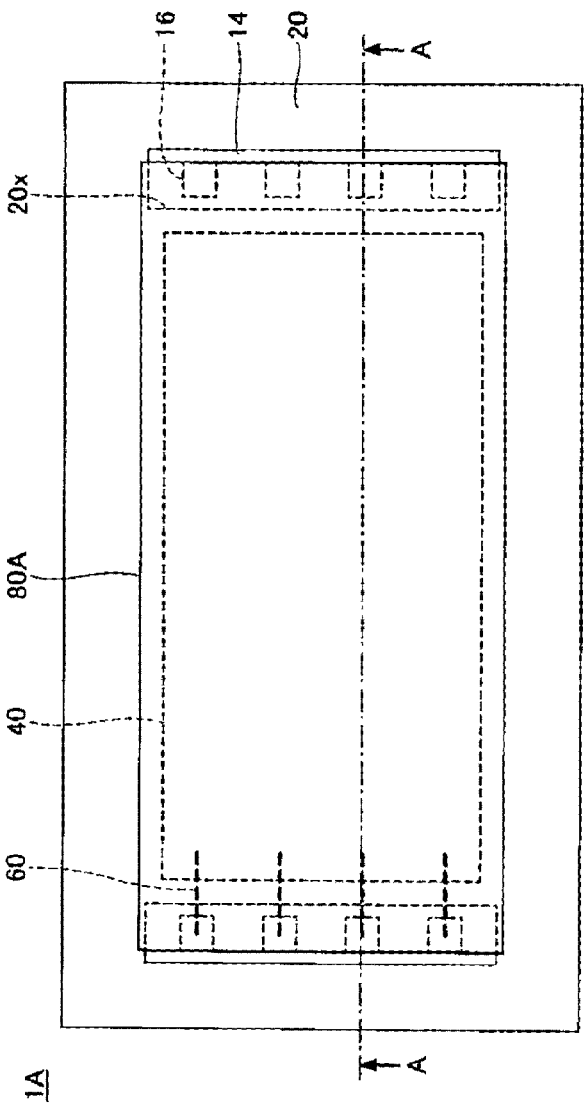
FIG. 7A
FIG. 7B

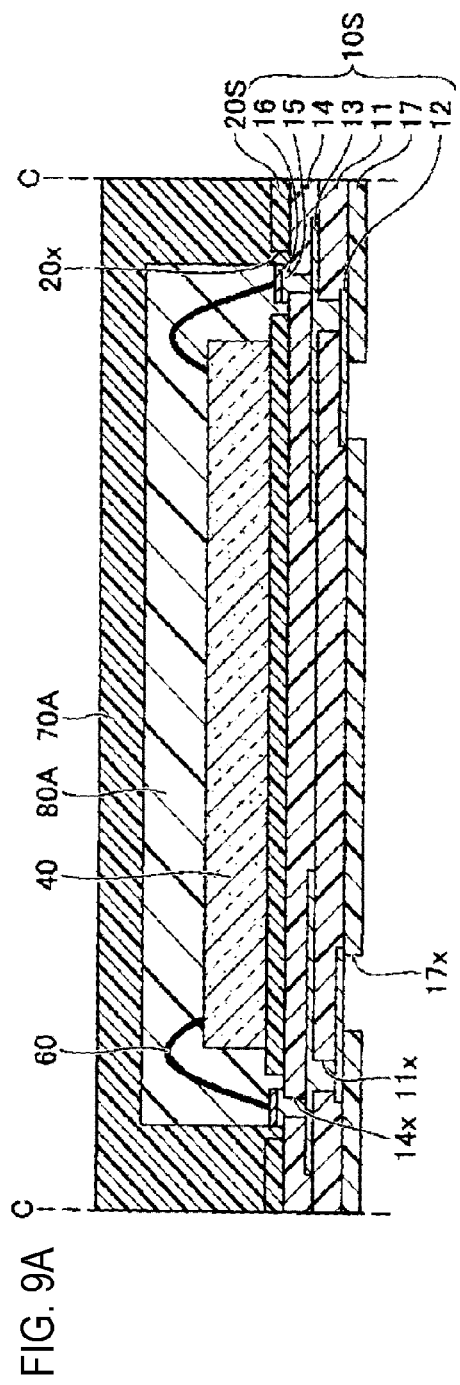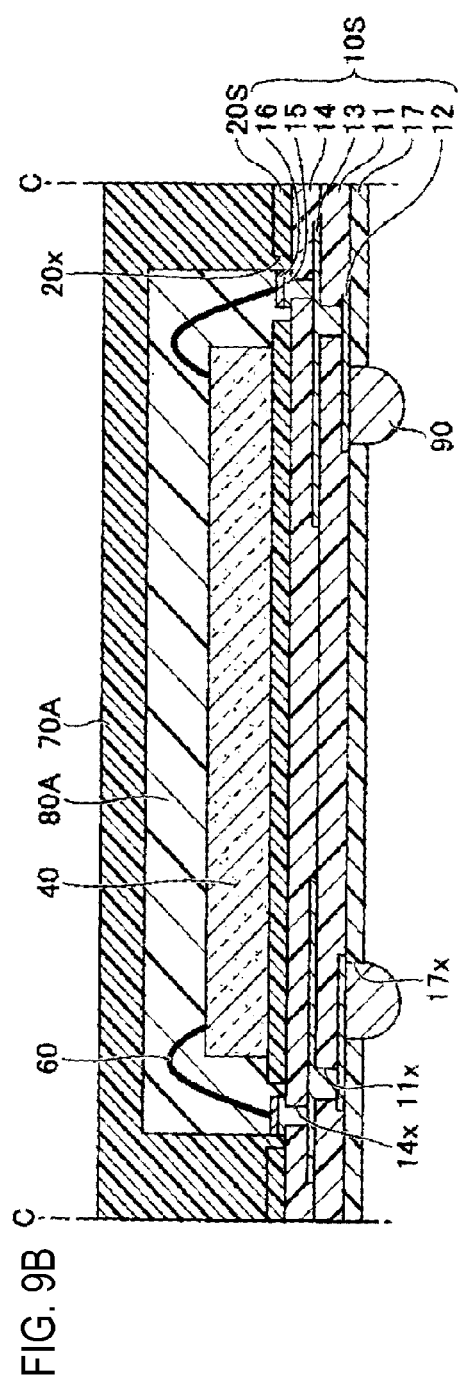

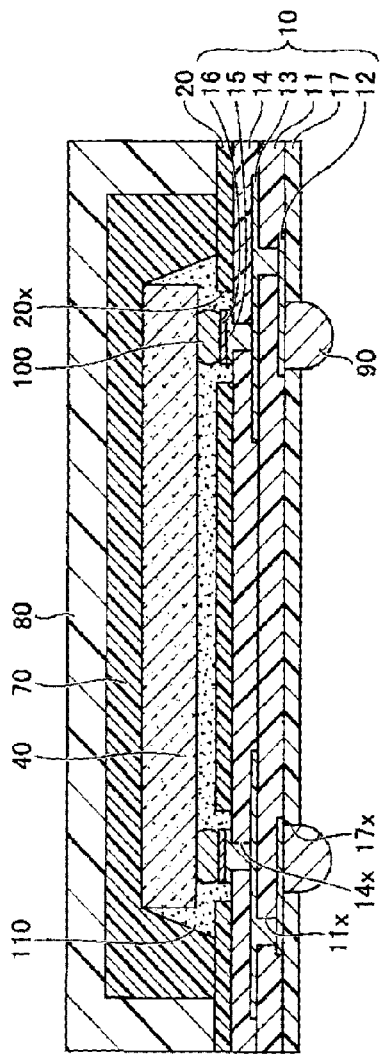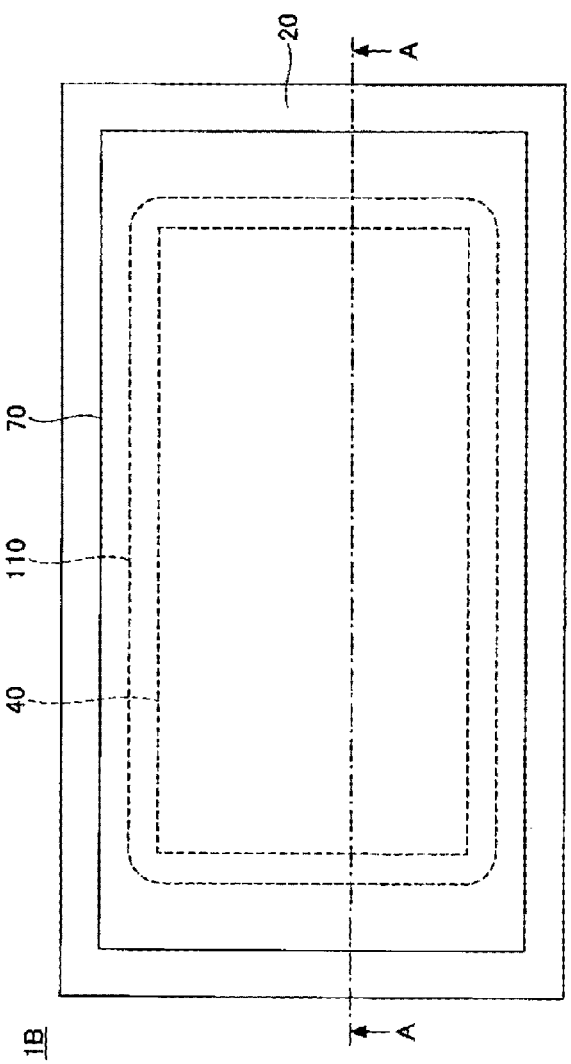
FIG. 10A
FIG. 10B

SEMICONDUCTOR DEVICE HAVING MULTIPLE MAGNETIC SHIELD MEMBERS

CROSS-REFERENCE TO RELATED APPLICATION(S)

This application claims priority from Japanese Patent Application No. 2014-201765, filed on Sep. 30, 2014, the entire contents of which are herein incorporated by reference.

BACKGROUND

1. Field

Exemplary embodiments of the invention relate to a semiconductor device and a method for manufacturing the same.

2. Related Art

In recent years, much attention has been paid to MRAMs (Magnetoresistive Random Access Memories), which are nonvolatile memories. Differently from DRAMs (Dynamic Random Access Memories) or SRAMs (Static Random Access Memories), which are volatile memories, MRAMs can hold content even if a current is not applied thereto. Accordingly, the rise time after power-on is short. In addition, since MRAMs can be set normally OFF, power consumption can be reduced drastically as compared with DRAMs or SRAMs.

MRAMs have excellent properties thus. However, MRAMs cannot operate without a magnetic shield that prevents an external magnetic field from affecting an element (a semiconductor chip).

As an example of the package of an MRAM provided with a magnetic shield member, for example, the following structure has been proposed. That is, a first magnetic shield member and a second magnetic shield member are disposed so that an element is disposed therebetween, and the first magnetic shield member and the second magnetic shield member are connected through a resin (for example, see JP 2013-207059 A).

SUMMARY

Generally, however, the magnetic permeability of a resin is lower than that of a magnetic shield member. Therefore, when a resin is put between the first magnetic shield member and the second magnetic shield member, the flow of magnetism is blocked in the resin portion. As a result, an external magnetic field cannot be suppressed from affecting the element.

Exemplary embodiments of the invention have been made in view of the above circumstances. Some exemplary embodiments of the invention provide a semiconductor device or the like that can suppress an external magnetic field from affecting an element of the semiconductor device.

According to one exemplary embodiment, a semiconductor device includes a wiring substrate, a lower magnetic shield member, a semiconductor chip, and an upper magnetic shield member. The lower magnetic shield member is provided on the wiring substrate. The semiconductor chip is provided on the lower magnetic shield member. The semiconductor chip includes a magnetic memory element. The upper magnetic shield member is provided on the semiconductor chip. The semiconductor chip is disposed between the upper magnetic shield member and the lower magnetic shield member. The lower magnetic shield member and the upper magnetic shield member include a soft magnetic resin. The lower magnetic shield member and the upper magnetic shield member are in direct contact with each other.

With the disclosed technique, it is possible to provide a semiconductor device or the like that can suppress an external magnetic field from affecting elements of the semiconductor device or the like.

BRIEF DESCRIPTION OF THE DRAWINGS

FIGS. 7A and 7B show a semiconductor device according to a second exemplary embodiment;

FIGS. 9A and 9B are views (part 2) showing the process for manufacturing the semiconductor device according to the second exemplary embodiment; and FIGS. 10A and 10B show a semiconductor device according to a modified example of the first exemplary embodiment.

DETAILED DESCRIPTION

Figure 1A:
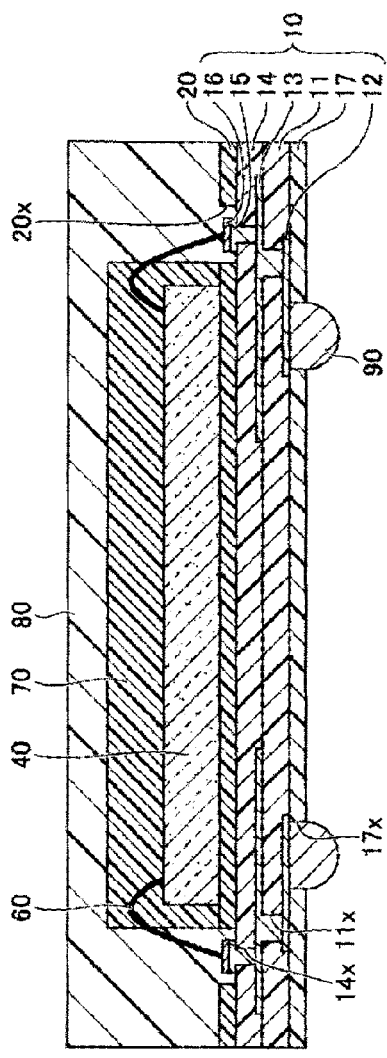
FIGS. 1A and 1B show a semiconductor device according to a first exemplary embodiment.

Exemplary embodiments of the invention will be described below with reference to the accompanying drawings. It is noted that in the drawings, the same reference signs will be used to indicate same or similar constituent components and that redundant description thereon may be omitted.

First Exemplary Embodiment

Structure of Semiconductor Device According to First Exemplary Embodiment

Figure 1B:
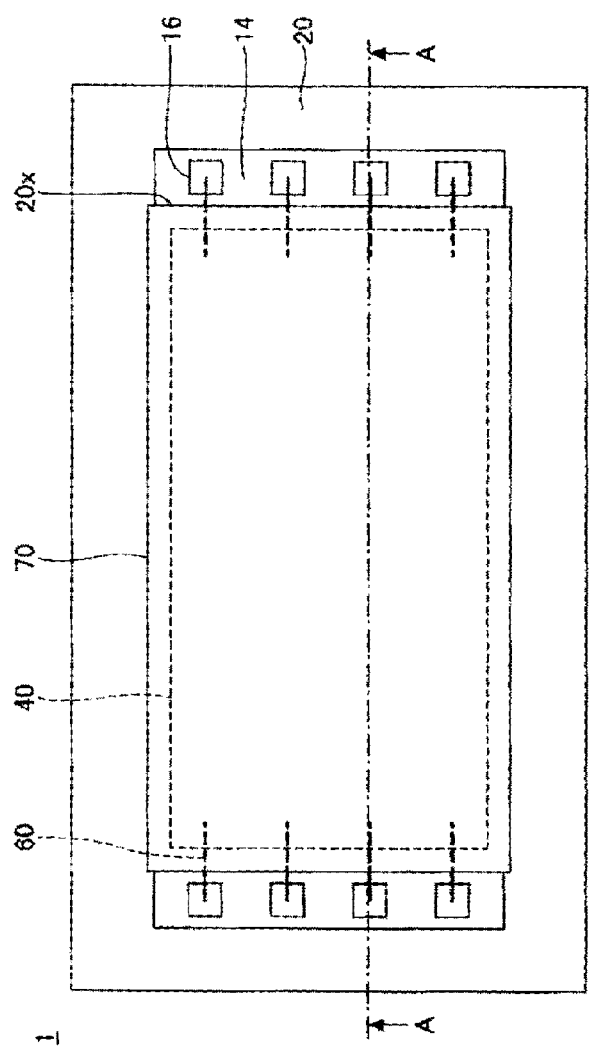

First, the structure of a semiconductor device according to a first exemplary embodiment will be described. FIGS. 1A and 1B show the semiconductor device according to the first exemplary embodiment. FIG. 1B is a plan view. FIG. 1A is a sectional view taken on a line A-A in FIG. 1B. It is noted that a mold resin 80 is not shown in FIG. 1B.

Referring to FIGS. 1A and 1B, the semiconductor device 1 includes a wiring substrate 10, a lower magnetic shield member 20, a semiconductor chip 40, bonding wires 60, an upper magnetic shield member 70, and a mold resin 80.

For the sake of convenience, a circuit formation surface side of the semiconductor chip 40 in the semiconductor device 1 will be referred to as an "upper side" or "one side," and a solder resist layer 17 side will be referred to as a "lower side" or "the other side." Also, a surface of each component on the circuit formation surface side of the semiconductor chip 40 will be referred to as "one surface" or an "upper surface," and a surface on the solder resist layer 17 side will be referred to as "the other surface" or a "lower surface." The semiconductor device 1 may be used upside down or may be disposed at a desired angle. Furthermore, a "plan view" means a view of an object observed from a normal direction of the circuit formation surface of the semiconductor chip 40, and a "planar shape" means a shape of an object observed from the normal direction of the circuit formation surface of the semiconductor chip 40.

In the wiring substrate 10, an insulating layer 11 is, for example, made of a thermosetting epoxy resin, a polyimide resin or the like. A wiring layer 12 that is, for example, made of copper (Cu) is embedded on a lower surface side of the insulating layer 11. A lower surface of the wiring layer 12 is exposed from the lower surface of the insulating layer 11. An upper surface and side surfaces of the wiring layer 12 are covered by the insulating layer 11. The lower surface of the wiring layer 12 may be, for example, flush with the lower surface of the insulating layer 11.

A wiring layer 13 that is, for example, made of copper (Cu) is formed on an upper surface side of the insulating layer 11. The wiring layer 13 includes via wirings and a wiring pattern, and is electrically connected to the wiring layer 12. Each via wiring is filled in a via hole 11x that penetrates the insulating layer 11 so as to expose an upper surface of the wiring layer 12. The wiring pattern is formed on an upper surface of the insulating layer 11.

An insulating layer 14 is, for example, made of a thermosetting epoxy resin, a polyimide resin or the like. The insulating layer 14 is formed on the insulating layer 11 so as to cover the wiring layer 13. Pads 15 that are, for example, made of copper (Cu) are formed on an upper surface of the insulating layer 14. The pads 15 are integrated with via wirings so as to be electrically connected to the wiring layer 13. Each via wiring is filled in a via hole 14x that penetrates the insulating layer 14 so as to expose an upper surface of the wiring layer 13.

A surface treated layer 16 is formed on an upper surface of each pad 15. Examples of the surface treated layer 16 include an Au layer, a Ni/Au (a metal layer in which a Ni layer and an Au layer are stacked in this order), a Ni/Pd/Au layer (a metal layer in which a Ni layer, a Pd layer and an Au layer are stacked in this order), and the like A solder resist layer formed with opening portions for exposing the pads 15 on which the surface treated layer 16 is formed may be provided on the upper surface of the insulating layer 14. In this case, the lower magnetic shield member 20 is provided on the solder resist layer.

The solder resist layer 17 is made of a photosensitive insulating resin or the like. The photosensitive insulating resin contains a phenolic resin, a polyimide resin or the like as its main component. The solder resist layer 17 is formed on the lower surface of the insulating layer 11. The solder resist layer 17 is formed with opening portions 17x. The lower surface of the wiring layer 12 is exposed to the opening portions 17x. A solder bump 90 (which is an example of an external connection terminal) may be formed on the lower surface of the wiring layer 12 exposed to the opening portions 17x.

The lower magnetic shield member 20 is provided on the wiring substrate 10. More specifically, the lower magnetic shield member 20 is made of a material having adhesiveness. The lower magnetic shield member 20 is bonded to the upper surface of the insulating layer 14, which is the outermost surface on the one side of the wiring substrate 10. The lower magnetic shield member 20 has a thickness, for example, in a range of about 50 μm to about 100 μm.

A soft magnetic resin may be used as the material of the lower magnetic shield member 20. For example, an epoxy resin containing fillers in which a soft magnetic material is circumferentially covered by an insulating film may be used as the soft magnetic resin. Examples of the soft magnetic material include soft iron. Examples of the insulating film include alumina. It is preferable that the magnetic permeability of the lower magnetic shield member 20 is in a range of about 10 to about 100. Also, it is preferable that the saturated magnetic flux density of the lower magnetic shield member 20 is in a range of about 0.5 (T) to about 1.5 (T).

The lower magnetic field member 20 is formed with opening portions 20x. Each opening portion 20x is a hole for exposing the pad 15 on which the surface treated layer 16 is formed. The opening portions 20x are provided on both sides of the semiconductor chip 40 to be across the semiconductor chip 40. There is a gap between an inner wall of each opening portion 20x and the corresponding pad 15. Therefore, each opening portion 20x and the corresponding pad 15 are not in contact with each other. Also, there is a gap between the inner wall of each opening portion 20x and the surface treated layer 16. Therefore, each opening portion 20x and the surface treated layer 16 are not in contact with each other. The planar shape of the opening portion 20x may be a desired shape such as a rectangle, so long as the pad 15 on which the surface treated layer 16 is formed can be exposed.

The semiconductor chip 40 is mounted between the opening portions 20x which are opposite to each other on the upper surface of the lower magnetic shield member 20. The semiconductor chip 40 is mounted in a face-up manner so that a circuit formation surface of the semiconductor chip 40 where electrode pads are formed faces the upper magnetic shield member 70. A back surface of the semiconductor chip 40 is directly covered by the lower magnetic shield member 20. The back surface of the semiconductor chip 40 faces the wiring substrate 10. More specifically, the back surface of the semiconductor chip 40 is covered by the lower magnetic shield member 20 and is in direct contact with the lower magnetic shield member 20. The semiconductor chip 40 is, for example, a memory chip (MRAM) in which magnetic memory elements are formed in a silicon substrate. A logic circuit and the like may be further provided in the semiconductor chip 40. Each electrode pad of the semiconductor chip 40 is electrically connected through the bonding wire 60 to the surface treated layer 16 on the pad 15 exposed in each opening portion 20x. A metal wire such as a gold wire or a copper wire may be used as the bonding wire 60.

The upper magnetic shield member 70 is provided on the lower magnetic shield member 20 so that the semiconductor chip 40 is located between the upper magnetic shield member 70 and the lower magnetic shield member 20. More specifically, the upper magnetic shield member 70 is provided on the lower magnetic shield member 20 so as to directly cover the circuit formation surface and the side surfaces of the semiconductor chip 40 and to cover a part (on the semiconductor ship 40 side) of each bonding wire 60. More specifically, the upper magnetic shield member 70 covers the circuit formation surface (upper surface) and the side surfaces of the semiconductor chip 40 and is in direct contact with the upper surface and the side surfaces of the semiconductor chip 40. Also, the upper magnetic shield member 70 partially covers each bonding wire 60 and is in contact with a part of each boding wire 60. The upper magnetic shield member 70 and the lower magnetic shield member 20 are in direct contact with each other. Thus, the semiconductor chip 40 has the structure that the circumference of the semiconductor chip 40 is entirely surrounded by the upper magnetic shield member 70 and the lower magnetic shield member 20.

The upper magnetic shield member 70 formed on the circuit formation surface of the semiconductor chip 40 may have a thickness, for example, in a range of about 50 μm to about 100 μm. A soft magnetic resin may be used as a material of the upper magnetic shield member 70 in the same manner as the lower magnetic shield member 20. In view of improvement in the flow of magnetism, it is preferable that the magnetic permeability and the saturated magnetic flux density of the upper magnetic shield member 70 are substantially equal to those of the lower magnetic shield member 20.

The upper magnetic shield member 70 may be provided to cover the whole of each bonding wire 60 (on the semiconductor chip 40 side and the surface treated layer 16 side). However, the bonding wire 60 may be disconnected due to the filler contained in the upper magnetic shield member 70. It is, therefore, preferable to reduce the portion where the bonding wire 60 is covered by the upper magnetic shield member 70.

The mold resin 80 is provided on the wiring substrate 10 so as to cover the lower magnetic shield member 20 and the upper magnetic shield member 70. For example, an epoxy resin or the like containing fillers such as silica may be used as the mold resin 80. The mold resin 80 may be provided to expose the upper surface of the upper magnetic shield member 70.

Method for Manufacturing Semiconductor Device According to First Exemplary Embodiment Next, a method for manufacturing the semiconductor device 1 according to the first exemplary embodiment will be described. FIGS. 2A to 6B show a process for manufacturing the semiconductor device according to the first exemplary embodiment.

Figure 2A:
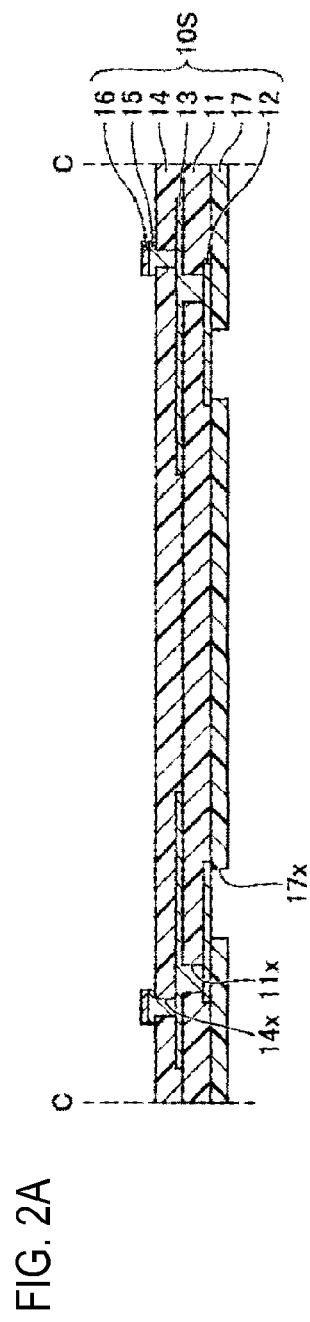
FIGS. 2A and 2B are views (part 1) showing a process for manufacturing the semiconductor device according to the first exemplary embodiment.
Figure 2B:
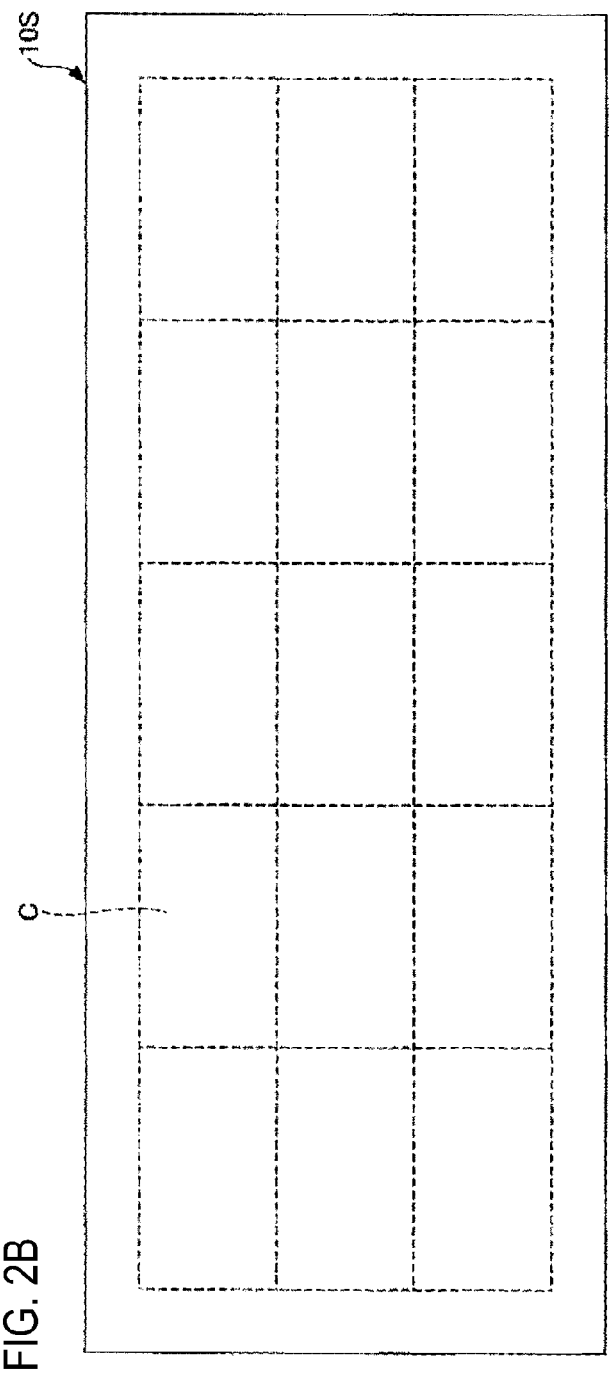

First, in a step shown in FIGS. 2A and 2B, a sheet-like wiring substrate 10S is prepared. The wiring substrate 10S has a plurality of regions C, which will be divided into individual wiring substrates 10. FIG. 2B is a plan view. FIG. 2A is a sectional view showing one of the regions C enclosed by the broken lines in FIG. 2B. It is noted that the fundamental structure of the wiring substrate 10S is similar to that of the wiring substrate 10. Also, the wiring substrate 10S may be produced by a well-known buildup method. However, another wiring substrate such as a layer structure produced by another method may be used.

Figure 3A:
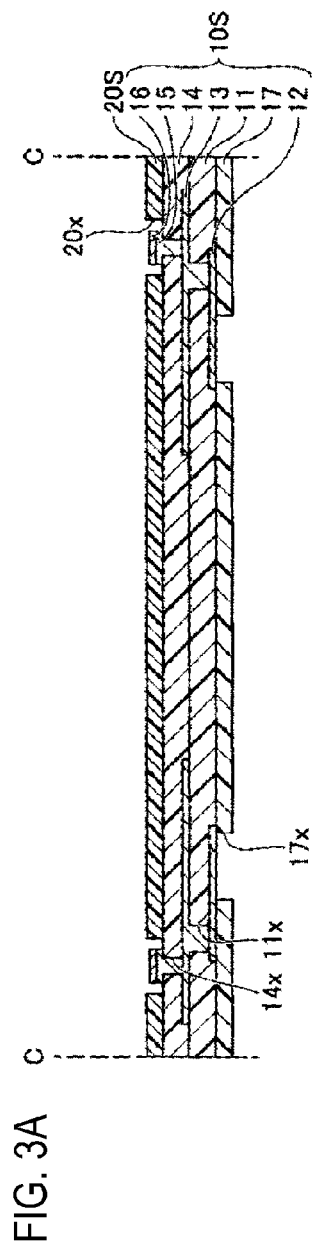
FIGS. 3A and 3B are views (part 2) showing the process for manufacturing the semiconductor device according to the first exemplary embodiment.
Figure 3B:
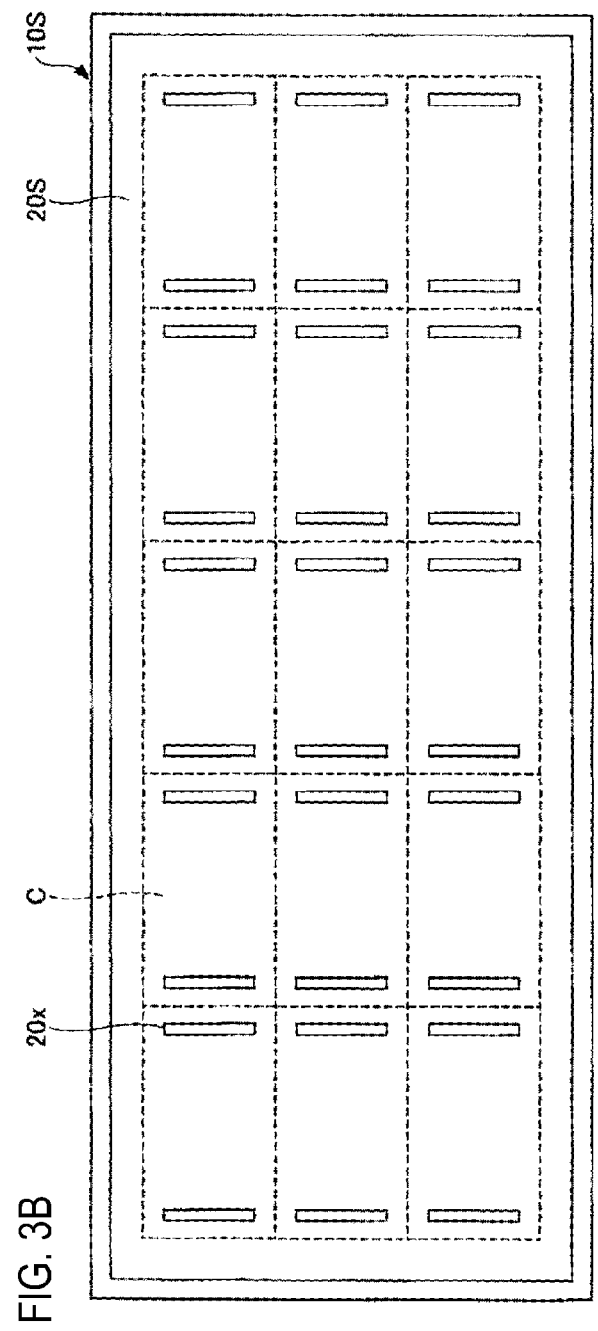

Next, in a step shown in FIGS. 3A and 3B, a sheet-like lower magnetic shield member 20S is bonded to an upper surface of the sheet-like wiring substrate 10S. The lower magnetic shield member 20S has a plurality of regions, which will be divided into individual lower magnetic shield members 20. FIG. 3B is a plan view. FIG. 3A is a sectional view showing one of the regions C enclosed by the broken lines in FIG. 3B.

More specifically, the sheet-like lower magnetic shield member 20S is prepared. For example, an epoxy resin film (for example, a die attach film) containing fillers in which a soft magnetic material such as soft iron is circumferentially covered by an insulating film such as alumina may be used as the material of the lower magnetic shield member 20S. It is preferable that the magnetic permeability of the lower magnetic shield member 20S is in a range of about 10 to about 100. Also, it is preferable that the saturated magnetic flux density of the lower magnetic shield member 20S is in a range of about 0.5 (T) to about 1.5 (T). Then, the opening portions 20x are formed in the sheet-like lower magnetic shield member 20S. Since the sheet-like lower magnetic shield member 20S contains a resin as its main component, the opening portions 20x can be formed easily by press working with a die, or the like. Then, the sheet-like lower magnetic shield member 20S formed with the opening portions 20x is bonded to the upper surface of the sheet-like wiring substrate 10S so that each pad 15 on which the surface treated layer 16 is formed is exposed in the corresponding opening portion 20x.

Figure 4A:
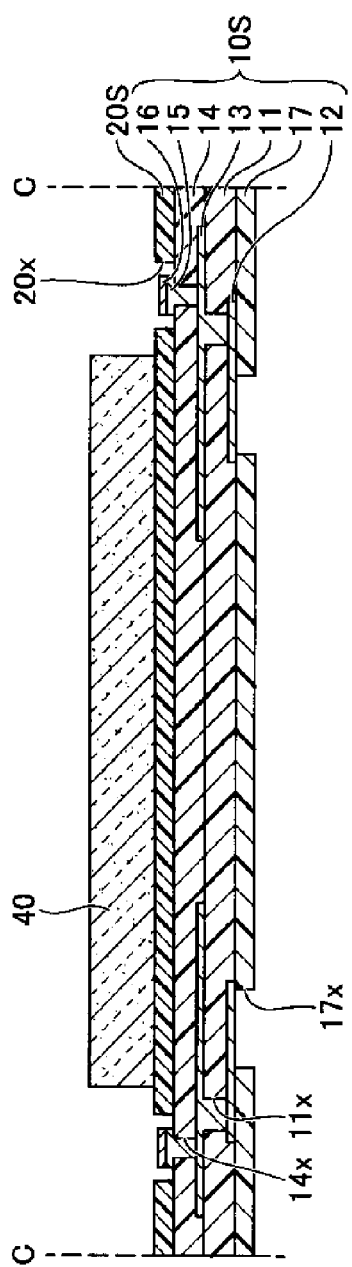
FIGS. 4A and 4B are views (part 3) showing the process for manufacturing the semiconductor device according to the first exemplary embodiment.
Figure 4B:
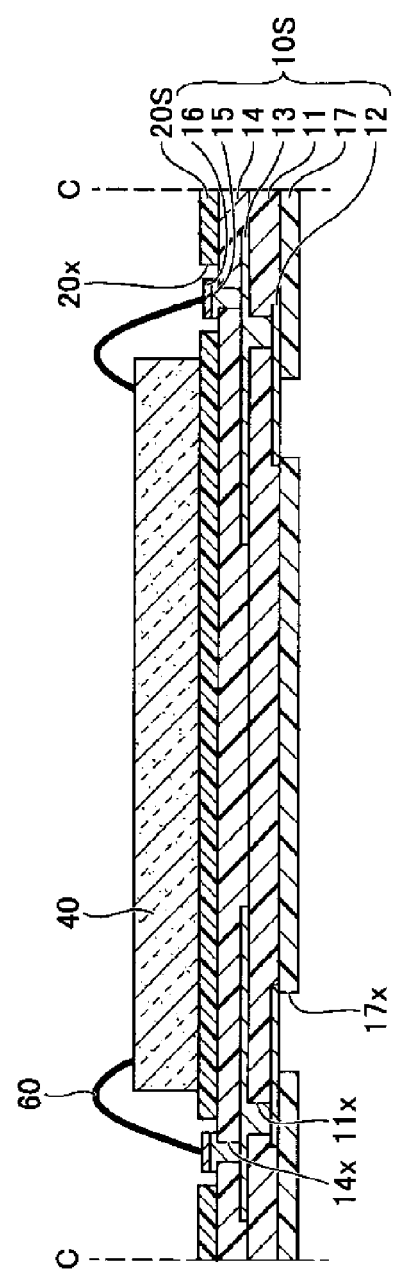

Next, in a step shown in FIG. 4A, the semiconductor chip 40 is mounted in a face-up manner in each region C enclosed by the broken lines and on the upper surface of the lower magnetic shield member 20S. Thus, the back surface of the semiconductor chip 40 is directly covered with the lower magnetic shield member 20S. Since the lower magnetic shield member 20S contains the resin as its main component and has adhesiveness, the semiconductor chip 40 can be mounted easily. Next, in a step shown in FIG. 4B, the electrode pads formed in the circuit formation surface of the semiconductor chip 40 are respectively connected to the surface treated layers 16 on the pads 15 exposed in the opening portions 20x, through bonding wires 60. FIGS. 4A and 4B are section views corresponding to FIG. 3A.

Figure 5A:
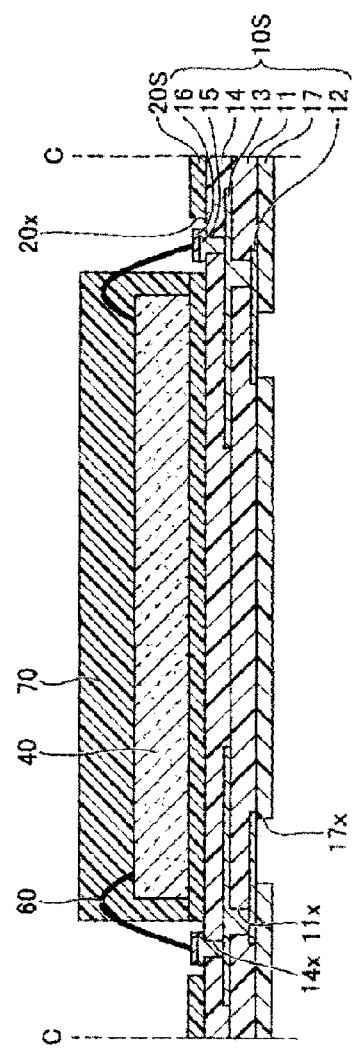
FIGS. 5A and 5B are views (part 4) showing the process for manufacturing the semiconductor device according to the first exemplary embodiment.
Figure 5B:
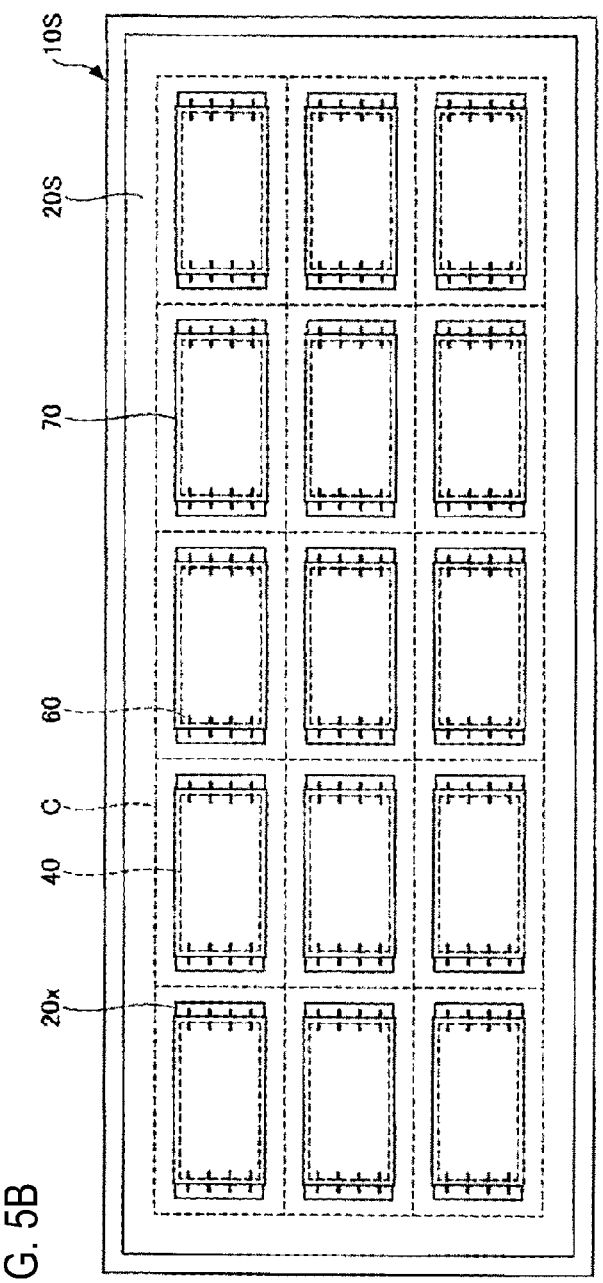

Next, in a step shown in FIGS. 5A and 5B, the upper magnetic shield member 70 is formed in each region C enclosed by the broken lines and on the upper surface of the lower magnetic shield member 20S, so as to cover the circuit formation surface and the side surfaces of the semiconductor chip 40 and to cover a part of each bonding wire 60. FIG. 5B is a plan view. FIG. 5A is a sectional view showing one of the regions C enclosed by the broken lines in FIG. 5B.

For example, the upper magnetic shield member 70 may be formed by a potting method using an epoxy resin or the like containing fillers in which a soft magnetic material such as soft iron is circumferentially covered by an insulating film such as alumina Thus, (i) each upper magnetic shield member 70 and (ii) the lower magnetic shield member 20S are in direct contact with each other. Also, the periphery of each semiconductor chip 40 is entirely surrounded by the upper magnetic shield member 70 and the lower magnetic shield member 20S.

Figure 6A:
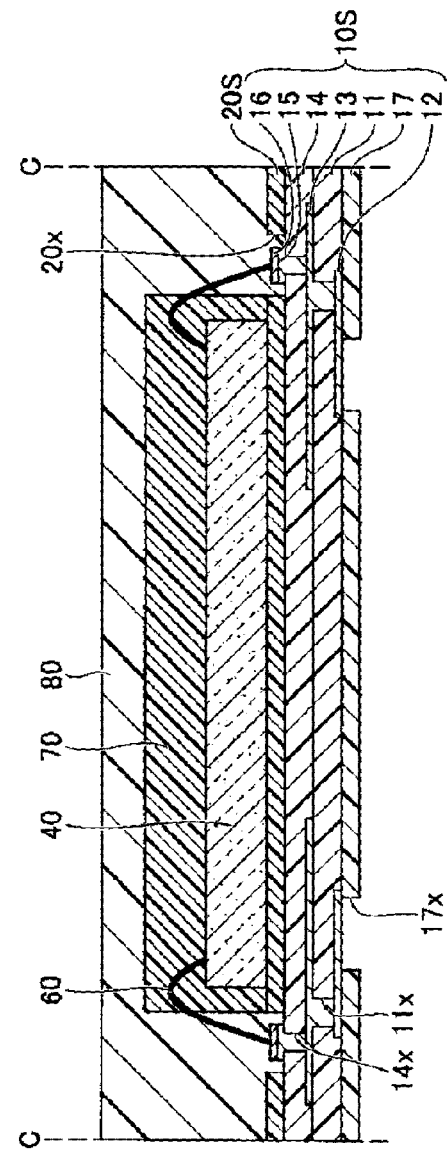
FIGS. 6A and 6B are views (part 5) showing the process for manufacturing the semiconductor device according to the first exemplary embodiment.

Next, in a step shown in FIG. 6A, a mold resin 80 is formed in each region C enclosed by the broken lines and on the wiring substrate 10S, so as to cover the lower magnetic shield member 20S and the upper magnetic shield member 70. For example, an epoxy resin or the like containing fillers such as silica may be used as the mold resin 80. The mold resin 80 may be, for example, formed by a transfer mold method. The mold resin 80 may be formed to expose the upper surface of the upper magnetic shield member 70.

Figure 6B:
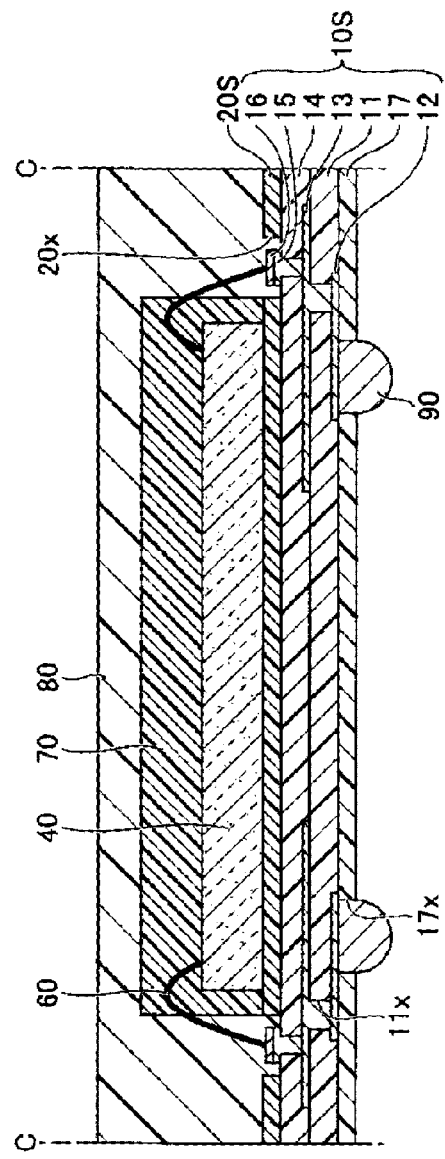

Next, in a step shown in FIG. 6B, a solder bump 90 is formed, by reflow or the like, in each region C enclosed by the broken lines and on the lower surface of the wiring layer 12 exposed to each opening portion 17x of a solder resist layer 17 of the wiring substrate 10S. Then, the structure shown in FIG. 6B is cut along the broken lines defining the regions C. Thus, a plurality of semiconductor devices 1 (see FIGS. 1A and 1B) segmented individually is completed.

In this manner, in the semiconductor device 1 according to the first exemplary embodiment, the semiconductor chip 40 is disposed between the upper magnetic shield member 70 and the lower magnetic shield member 20 which are made of soft magnetic resin. The upper magnetic shield member 70 and the lower magnetic shield member 20 are in direct contact with each other without intervention of any material that blocks the flow of magnetism (such as a resin containing no soft magnetic material). Accordingly, the flow of magnetism between the upper magnetic shield member 70 and the lower magnetic shield member 20 can be improved so that an external magnetic field is suppressed from affecting the semiconductor chip 40. Particularly, when the soft magnetic resin whose magnetic permeability is in the range of about 50 to about 100 and whose saturated magnetic flux density is in the range of about 0.5 (T) to about 1.5 (T) is used as the materials of the upper magnetic shield member 70 and the lower magnetic shield member 20, the above-described advantageous effect is further enhanced.

What material should be selected from the viewpoints of the magnetic permeability and the saturated magnetic flux density depends on the properties of a semiconductor chip to be used. That is, the level of required performance to block an external magnetic field depends on the properties of the semiconductor chip to be used. Therefore, a material having magnetic permeability and saturated magnetic flux density high enough to meet the required performance may be selected. In some required performance, a material having magnetic permeability and saturated magnetic flux density out of the aforementioned range may be selected. However, when the magnetic permeability not lower than 1,000 is required, it would be difficult to meet the required magnetic permeability by using a soft magnetic resin. In this case, it is, therefore, necessary to consider using magnetic shield members made of a metal, or the like.

Also, the respective steps for manufacturing the semiconductor device 1 according to the first exemplary embodiment may be implemented with the same equipment as those for manufacturing a related-art semiconductor device (a semiconductor device mounted with a semiconductor chip having no magnetic memory element). Accordingly, the semiconductor device 1 according to the first exemplary embodiment is expected to be assembled at a low price.

Second Exemplary Embodiment

A second exemplary embodiment shows an example in which a semiconductor chip is covered by a lower magnetic shield member and an upper magnetic shield member through a mold resin. In the second exemplary embodiment, description may be omitted as to constituent components which are the same as or similar to those in the first exemplary embodiment.

Structure of Semiconductor Device According to Second Exemplary Embodiment

First, the structure of the semiconductor device according to the second exemplary embodiment will be described. FIGS. 7A and 7B show the semiconductor device 1A according to the second exemplary embodiment. FIG. 7B is a plan view. FIG. 7A is a sectional view taken on a line A-A in FIG. 7B. In FIG. 7B, an upper magnetic shield member 70A is not shown.

Referring to FIGS. 7A and 7B, in the semiconductor device 1A, a semiconductor chip 40 and bonding wires 60, which are mounted on a lower magnetic shield member 20, are sealed by a mold resin 80A. An upper magnetic shield member 70A is provided on a wiring substrate 10 so as to cover the mold resin 80A.

In the semiconductor device 1A, the back surface of the semiconductor chip 40 is directly covered by the lower magnetic shield member 20. More specifically, the back surface of the semiconductor chip 40 is covered by the lower magnetic shield member 20 and is in direct contact with an upper surface of the lower magnetic shield member 20. Also, the mold resin 80A is provided on the lower magnetic shield member 20 so as to directly cover the circuit formation surface and the side surfaces of the semiconductor chip 40. More specifically, the mold resin 80A covers the circuit formation surface and the side surfaces of the semiconductor chip 40 and is direct contact with the circuit formation surface and the side surfaces of the semiconductor chip 40. Furthermore, the upper magnetic shield member 70A is provided to cover the mold resin 80A and to be in direct contact with the lower magnetic shield member 20 extending from the semiconductor chip 40 side to the periphery of the mold resin 80A. That is, in the semiconductor device 1A, the upper surface and the side surfaces of the semiconductor chip 40 are covered by the upper magnetic shield member 70A through the mold resin 80A. The materials of the mold resin 80A and the upper magnetic shield member 70A may be, for example, similar to those of the mold resin 80 and the upper magnetic shield member 70 according to the first exemplary embodiment.

Method for Manufacturing Semiconductor Device According to Second Exemplary Embodiment Next, a method for manufacturing the semiconductor device 1A according to the second exemplary embodiment will be described. FIGS. 8A to 9B show a process for manufacturing the semiconductor device 1A according to the second exemplary embodiment. First, steps similar to those of FIGS. 2A to 4B in the first exemplary embodiment are carried out.

Figure 8A:
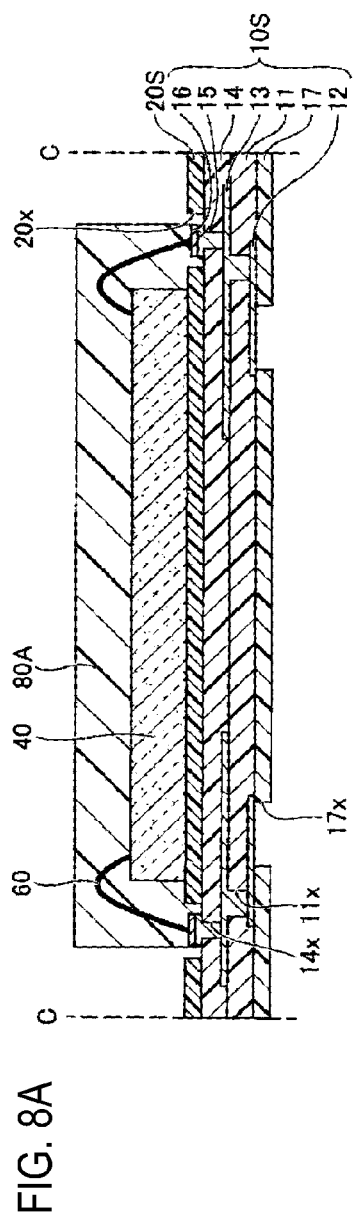
FIGS. 8A and 8B are views (part 1) showing a process for manufacturing the semiconductor device according to the second exemplary embodiment.
Figure 8B:
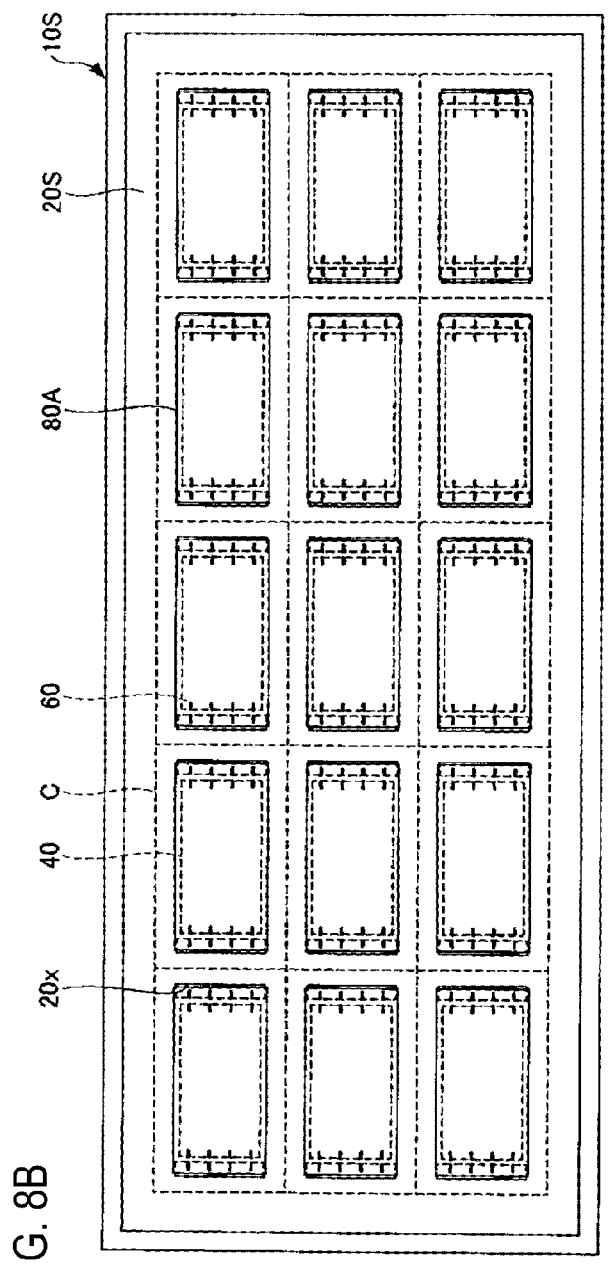

Next, in a step shown in FIGS. 8A and 8B, a mold resin 80A is formed in each region C enclosed by the broken lines and on the upper surface of a lower magnetic shield member 20S so as to directly cover the circuit formation surface and the side surfaces of a semiconductor chip 40 and to cover the whole of each bonding wire 60. FIG. 8B is a plan view. FIG. 8A is a sectional view showing one of the regions C enclosed by the broken lines in FIG. 8B.

For example, the mold resin 80A may be formed by a transfer mold method or a potting method using an epoxy resin or the like containing fillers such as silica. In this manner, the mold resin 80A seals the semiconductor chips 40 and the bonding wires 60 which are mounted on the lower magnetic shield member 20S.

Next, in a step shown in FIG. 9A, the upper magnetic shield member 70A is formed in each region C enclosed by the broken lines and on the upper surface of the wiring substrate 10. More specifically, the upper magnetic shield member 70A is formed to cover the upper surface and the side surfaces of the mold resin 80A and to be in direct contact with the lower magnetic shield member 20S extending from the semiconductor chip 40 side to the periphery of the mold resin 80A. For example, the upper magnetic shield member 70 may be formed by a transfer mold method or a potting method using an epoxy resin or the like containing fillers in which a soft magnetic material such as soft iron is circumferentially covered by an insulating film such as alumina. Thus, each semiconductor chip 40 is covered by the lower magnetic shield member 20S and the upper magnetic shield member 70A, through the mold resin 80A.

In this manner, in the semiconductor device 1A according to the second exemplary embodiment, the mold resin 80A is provided to directly cover the circuit formation surface and the side surfaces of the semiconductor chip 40 and to cover the whole of each bonding wire 60. Then, the upper magnetic shield material 70A is provided to cover the mold resin 80A and to be in direct contact with the lower magnetic shield member 20 extending from the semiconductor chip 40 side to the periphery of the mold resin 80A.

In this structure, in the same manner as in the first exemplary embodiment, the semiconductor chip 40 is disposed between the upper magnetic shield member 70A and the lower magnetic shield member 20 which are made of soft magnetic resin. Also, the upper magnetic shield member 70A and the lower magnetic shield member 20 are in direct contact with each other without intervention of any material blocking the flow of magnetism (such as a resin containing no soft magnetic material). Accordingly, a similar effect to that in the first exemplary embodiment can be obtained.

Also, the whole of each bonding wire 60 is covered by the mold resin 80A so that the bonding wire 60 is not in contact with the upper magnetic shield member 70A. It is, therefore, possible to avoid the concern that the bonding wire 60 may be disconnected due to the fillers contained in the upper magnetic shield member 70A.

Modified Example of First Exemplary Embodiment

A modified example of the first exemplary embodiment will be described below. In the modified example, a semiconductor chip 40 is connected to a wiring substrate 10 in a flip-chip manner. It is noted that description may be omitted as to constituent components which are similar to or the same as those in the first and/or second exemplary embodiments.

FIGS. 10A and 10B shows a semiconductor device 1B according to the modified example of the first exemplary embodiment. FIG. 10B is a plan view. FIG. 10A is a sectional view taken on a line A-A in FIG. 10B. In FIG. 10B, a mold resin 80 is not shown.

Referring to FIGS. 10A and 10B, in the semiconductor device 1B, the semiconductor chip 40 is connected to a wiring substrate 10 in a flip-chip manner. More specifically, the semiconductor chip 40 is mounted in a face-down manner so that a circuit formation surface where electrode pads are formed faces a lower magnetic shield member 20. The electrode pads of the semiconductor chip 40 are electrically connected to pads 15. The pads 15 are exposed to opening portions 20x of the lower magnetic shield member 20 through bumps 100 (such as solder bumps). A surface treated layer 16 is formed on an upper surface of each pad 15.

An underfill resin 110 is filled between the semiconductor 40 and the lower magnetic shield member 20 so that the bumps 100 is covered by the underfill resin 110. An upper magnetic shield member 70 is provided on the lower magnetic shield member 20 so as to cover the semiconductor chip 40 and the underfill resin 110. The upper magnetic shield member 70 and the lower magnetic shield member 20 are in direct contact with each other.

In this manner, in the modified example of the first exemplary embodiment, the semiconductor chip 40 is connected to the wiring substrate 10 in the flip-chip manner. Also in this case, in the same manner as in the first exemplary embodiment, the semiconductor chip 40 is disposed between the upper magnetic shield member 70 and the lower magnetic shield member 20 which are made of the soft magnetic resin. The upper magnetic shield member 70 and the lower magnetic shield member 20 are in direct contact with each other without intervention of any material blocking the flow of magnetism (such as resin containing no soft magnetic material). Therefore, a similar effect to that in the first exemplary embodiment can be obtained.

It is noted that in the second exemplary embodiment, the semiconductor chip 40 may be connected to the wiring substrate 10 in a flip-chip manner.

Clauses

This disclosure further encompasses various exemplary embodiments, for example, described below.

1. A method for manufacturing a semiconductor device, the method comprising
  providing a lower magnetic shield member on a wiring substrate;
  mounting a semiconductor chip on the lower magnetic shield member, the semiconductor chip including a magnetic memory element; and
  providing an upper magnetic shield member on the semiconductor chip so that
    (i) the semiconductor chip is disposed between the upper magnetic shield member and the lower magnetic shield member, and
    (ii) the lower magnetic shield member and the upper magnetic shield member are in direct contact with each other, wherein
  the lower magnetic shield member and the upper magnetic shield member include a soft magnetic resin.

(2) The method of the clause (1) further comprising:
  providing a sealing resin, wherein
  the semiconductor chip comprises
    a first surface that faces the wiring substrate,
    a second surface that is opposite from the first surface, and
    side surfaces connecting the first and second surfaces,
  the mounting the semiconductor chip mounts the semiconductor chip so that
    (i) the first surface of the semiconductor chip is covered by the lower magnetic shield member, and
    (ii) the first surface of the semiconductor chip is in direct contact with the lower magnetic shield member,
  the providing the upper magnetic shield member provides the upper magnetic shield member on the lower magnetic shield member so that
    (i) the upper magnetic shield member covers the second surface of the semiconductor chip and the side surfaces of the semiconductor chip, and
    (ii) the upper magnetic shield member is in direct contact with the second surface of the semiconductor chip and the side surfaces of the semiconductor chip, and
  the providing the sealing resin provides the sealing resin to cover the upper magnetic shield member after the providing the upper magnetic shield member.

(3) The method of the clause (1) further comprising:
  providing a sealing resin on the lower magnetic shield member, wherein
  the semiconductor chip comprises
    a first surface that faces the wiring substrate, and
    a second surface that is opposite from the first surface,
  the mounting the semiconductor chip mounts the semiconductor chip so that
    (i) the first surface of the semiconductor chip is covered by the lower magnetic shield member, and (ii) the first surface of the semiconductor chip is in direct contact with the lower magnetic shield member, the providing the sealing resin provides the sealing resin to cover the second surface of the semiconductor chip before the providing the upper magnetic shield member, and the providing the upper magnetic shield member provides the upper magnetic shield member to cover the sealing resin and to be in direct contact with the lower magnetic shield member extending from a semiconductor chip side to a periphery of the sealing resin.

The exemplary embodiments and modified examples have been described above. It should be noted that the invention is not limited thereto. Various modifications and replacements may be made to the exemplary embodiments and modified examples without departing from the scope of claims.

What is claimed is:

1. A semiconductor device comprising:
a wiring substrate;
a lower magnetic shield member that is provided on the wiring substrate;
a semiconductor chip that is provided on the lower magnetic shield member, the semiconductor chip including a magnetic memory element; and
an upper magnetic shield member that is provided on the semiconductor chip, the semiconductor chip being disposed between the upper magnetic shield member and the lower magnetic shield member,
wherein
the lower magnetic shield member and the upper magnetic shield member include a soft magnetic resin,
the lower magnetic shield member and the upper magnetic shield member are in direct contact with each other, and
the soft magnetic resin includes a resin having fillers in which a soft magnetic material is circumferentially covered by an insulating film.

2. The semiconductor device of claim 1, wherein the soft magnetic material includes soft iron.

3. The semiconductor device of claim 1, wherein the insulating film includes alumina.

4. A semiconductor device comprising:
a wiring substrate;
a lower magnetic shield member that is provided on the wiring substrate;
a semiconductor chip that is provided on the lower magnetic shield member, the semiconductor chip including a magnetic memory element;
an upper magnetic shield member that is provided on the semiconductor chip, the semiconductor chip being disposed between the upper magnetic shield member and the lower magnetic shield member; and
a sealing resin that is provided on the wiring substrate so as to cover the upper magnetic shield member,
wherein
the lower magnetic shield member and the upper magnetic shield member include a soft magnetic resin, the soft magnetic resin including a resin having soft magnetic fillers,
the lower magnetic shield member and the upper magnetic shield member are in direct contact with each other,
the semiconductor chip comprises
a first surface that faces the wiring substrate,
a second surface that is opposite from the first surface, and
side surfaces connecting the first and second surfaces,
the first surface of the semiconductor chip is covered by the lower magnetic shield member,
the first surface of the semiconductor chip is in direct contact with the lower magnetic shield member,
the second surface of the semiconductor chip and the side surfaces of the semiconductor chip are covered by the upper magnetic shield member, and
the second surface of the semiconductor chip and the side surfaces of the semiconductor chip are in direct contact with the upper magnetic shield member.

5. The semiconductor device of claim 4, wherein
the semiconductor chip is mounted on the lower magnetic shield member so that electrode pads of the semiconductor chip face the upper magnetic shield member,
opening portions are formed in the lower magnetic shield member so as to expose pads of the wiring substrate, and
the electrode pads of the semiconductor chip and the pads of the wiring substrate are electrically connected to each other through metal wires.

6. The semiconductor device of claim 5, wherein the sealing resin covers only a part of each metal wire.

7. The semiconductor device of claim 4, wherein the soft magnetic resin includes the resin having the soft magnetic fillers in which a soft magnetic material is circumferentially covered by an insulating film.

8. The semiconductor device of claim 7, wherein the soft magnetic material includes soft iron.

9. The semiconductor device of claim 7, wherein the insulating film includes alumina.

10. A semiconductor device comprising:
a wiring substrate;
a lower magnetic shield member that is provided on the wiring substrate;
a semiconductor chip that is provided on the lower magnetic shield member, the semiconductor chip including a magnetic memory element;
an upper magnetic shield member that is provided on the semiconductor chip, the semiconductor chip being disposed between the upper magnetic shield member and the lower magnetic shield member; and
a sealing resin that is provided on the lower magnetic shield member,
wherein
the lower magnetic shield member and the upper magnetic shield member include a soft magnetic resin,
the lower magnetic shield member and the upper magnetic shield member are in direct contact with each other,
the semiconductor chip comprises
a first surface that faces the wiring substrate,
a second surface that is opposite from the first surface, and
the first surface of the semiconductor chip is covered by the lower magnetic shield member,
the first surface of the semiconductor chip is in direct contact with the lower magnetic shield member,
the sealing resin covers the second surface of the semiconductor chip,
the sealing resin is in direct contact with the second surface of the semiconductor chip,
the upper magnetic shield member covers the sealing resin,
the upper magnetic shield member is in direct contact with the lower magnetic shield member, which extends from a semiconductor chip side to a periphery of the sealing resin.

11. The semiconductor device of claim 10, wherein
the semiconductor chip is mounted on the lower magnetic shield member so that electrode pads of the semiconductor chip face the upper magnetic shield member,
opening portions are formed in the lower magnetic shield member so as to expose pads of the wiring substrate, and
the electrode pads of the semiconductor chip and the pads of the wiring substrate are electrically connected to each other through metal wires.

12. The semiconductor device of claim 11, wherein the sealing resin covers the whole of each metal wire.

13. The semiconductor device of claim 10, wherein the soft magnetic resin includes a resin having fillers in which a soft magnetic material is circumferentially covered by an insulating film.

14. The semiconductor device of claim 13, wherein the soft magnetic material includes soft iron.

15. The semiconductor device of claim 13, wherein the insulating film includes alumina.

16. A semiconductor device comprising:
a wiring substrate;
a lower magnetic shield member that is provided on the wiring substrate;
a semiconductor chip that is provided on the lower magnetic shield member, the semiconductor chip including a magnetic memory element;
an upper magnetic shield member that is provided on the semiconductor chip, the semiconductor chip being disposed between the upper magnetic shield member and the lower magnetic shield member; and
an underfill resin that is provided between the semiconductor chip and the lower magnetic shield member, wherein
the lower magnetic shield member and the upper magnetic shield member include a soft magnetic resin,
the lower magnetic shield member and the upper magnetic shield member are in direct contact with each other,
the semiconductor chip comprises
a first surface that faces the wiring substrate, and
a second surface that is opposite from the first surface,
the second surface of the semiconductor chip is covered by the upper magnetic shield member, and
the second surface of the semiconductor chip is in direct contact with the upper magnetic shield member.

17. The semiconductor device of claim 16, wherein
electrode pads of the semiconductor chip faces the lower magnetic shield member,
opening portions are formed in the lower magnetic shield member so as to expose pads of the wiring substrate, and
the electrode pads of the semiconductor chip and the pads of the wiring substrate are electrically connected to each other through bumps.

18. The semiconductor device of claim 16, wherein the soft magnetic resin includes a resin having fillers in which a soft magnetic material is circumferentially covered by an insulating film.

19. The semiconductor device of claim 18, wherein the soft magnetic material includes soft iron.

20. The semiconductor device of claim 18, wherein the insulating film includes alumina.

* * * * *